(12) United States Patent
Diem et al.

(10) Patent No.: US 7,443,002 B2
(45) Date of Patent: Oct. 28, 2008

(54) ENCAPSULATED MICROSTRUCTURE AND METHOD OF PRODUCING ONE SUCH MICROSTRUCTURE

(75) Inventors: Bernard Diem, Echirolles (FR); Gilles Delapierre, Seyssins (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/537,372

(22) PCT Filed: Dec. 18, 2003

(86) PCT No.: PCT/FR03/50189

§ 371 (c)(1),
(2), (4) Date: Jun. 3, 2005

(87) PCT Pub. No.: WO2004/058628

PCT Pub. Date: Jul. 15, 2004

(65) Prior Publication Data

US 2006/0049471 A1    Mar. 9, 2006

(30) Foreign Application Priority Data

Dec. 20, 2002  (FR) .................................. 02 16331

(51) Int. Cl.
*G01L 1/12* (2006.01)
(52) U.S. Cl. ................. 257/415; 257/E21.32; 257/414; 257/417; 257/678; 438/106; 438/121; 216/2
(58) Field of Classification Search ................. 257/678, 257/701, E21.32, 417, 414, 415, 704, 710, 257/723; 438/106, 121, 125, 456, 723; 216/2, 216/79; 73/504.12, 504.02, 504.14

See application file for complete search history.

(56) References Cited

U.S. PATENT DOCUMENTS

| | | | | |
|---|---|---|---|---|
| 5,723,353 A | * | 3/1998 | Muenzel et al. | 438/48 |
| 5,963,788 A | * | 10/1999 | Barron et al. | 438/48 |
| 6,012,336 A | * | 1/2000 | Eaton et al. | 73/754 |
| 6,436,853 B2 | * | 8/2002 | Lin et al. | 438/800 |
| 6,452,238 B1 | * | 9/2002 | Orcutt et al. | 257/415 |
| 6,465,280 B1 | * | 10/2002 | Martin et al. | 438/125 |
| 6,624,003 B1 | * | 9/2003 | Rice | 438/106 |
| 6,635,509 B1 | * | 10/2003 | Ouellet | 438/106 |

(Continued)

FOREIGN PATENT DOCUMENTS

DE    198 20 816    11/1999

(Continued)

*Primary Examiner*—Chris C. Chu
(74) *Attorney, Agent, or Firm*—Oblon, Spivak, McClelland, Maier & Neustadt, P.C.

(57) ABSTRACT

A microstructure including in a first layer insulated from a substrate by an insulator layer at least one sensitive element connected to at least one contact pad by an electrical connection and protected by a package cap. The sensitive element, the electrical connection, and the contact pad form an assembly delimited in the first layer by at least one trench, the assembly being covered by the package cap. The package cap includes at least one opening above the contact pad and is integral with the contact pad on the edges of the opening and with a zone located beyond the trench in relation to the assembly. Such a microstructure can find application in particular in microelectromechanical structures.

14 Claims, 5 Drawing Sheets

U.S. PATENT DOCUMENTS

| | | | |
|---|---|---|---|
| 6,859,119 B2 * | 2/2005 | Eliacin et al. | 333/262 |
| 6,949,807 B2 * | 9/2005 | Eskridge et al. | 257/415 |
| 7,005,732 B2 * | 2/2006 | Horning et al. | 257/678 |
| 2003/0122227 A1 * | 7/2003 | Silverbrook | 257/678 |
| 2004/0173886 A1 * | 9/2004 | Carley | 257/678 |
| 2005/0227401 A1 * | 10/2005 | Lee et al. | 438/51 |

FOREIGN PATENT DOCUMENTS

| | | |
|---|---|---|
| EP | 0 451 992 | 10/1991 |

* cited by examiner

ENCAPSULATED MICROSTRUCTURE AND METHOD OF PRODUCING ONE SUCH MICROSTRUCTURE

TECHNICAL FIELD

The present invention relates to a microstructure, whereby the term microstructure is taken to mean a component obtained by MEMS technologies (Micro Electro Mechanical System) or technologies known under the more generic abbreviation of MST (Micro System Technology). Said components use semi-conductor micromachining technologies and comprise on a same substrate at least one mechanical and/or optical and/or electromagnetic and/or thermal and/or fluidic device combined or not with electronics to carry out a determined function. Said microstructures were first developed in the 1970s and now have commercial applications particularly in the automobile sector, for example as accelerometers for inflatable safety airbags or rate gyros as well as in the medical field or the aerospace field.

STATE OF THE PRIOR ART

There are two major categories of microstructures (which may be found on a same substrate): those of the sensor type, which measure a magnitude such as a rate of rotation, an acceleration, etc. and those of the actuator type, which control an action, for example which control a micro-relay.

Said microstructures comprise at least one element known as a sensitive element or transducer, which is suspended above the substrate. This may be, for example, the oscillating system or arm of an actuator capable of being displaced in relation to the substrate. Due to its small dimensions, said sensitive and mobile element is fragile and it must be protected by a package cap from dust, humidity, pressure, etc., in particular when the individual components are cut up since said components are manufactured by batches. Said sensitive element must be electrically connected to one or several contact pads accessible from the exterior of the package cap. Said contact pads may be used to inject a control signal into the sensitive element or, on the contrary, to recover information from the sensitive element.

A solid package cap covering the sensitive element may be added and hermetically sealed to the substrate for example by fusible glass as in document [1], the references of which are detailed at the end of the description. Contact pads are located at the exterior of the package cap, they are connected to the sensitive element by an electrical connection that is covered with a passivation layer, the sealing joint of the package cap covers said passivation layer. The disadvantage of said package cap is that it has a wide sealing joint that occupies a non negligible area on the surface of the substrate, that its installation and its sealing require the use of specific equipment and that finally its assembly is distant from conventional methods used in microelectronics in which the manufacture is carried out by batches using physical/chemical methods (deposition of thin films and microlithography).

It has been proposed in documents [2] and [3], the identification of which are detailed at the end of the description, forming a package cap covering a resonator by similar techniques to that used for forming the resonator: in other words a succession of steps of depositing, etching, micromachining or dissolving materials at the appropriate places. The occupied surface on the substrate is reduced. However, in these documents the resonators are obtained with thin films (substantially less than 5 micrometers). The electrical connection between the resonator and the contact pad runs along the surface of the substrate and the edge of the package cap is located astride the electrical connection, leaving the contact pad on the exterior so that it can be accessible. Thanks to these thin films, the formation of the electrical connection and the package cap is compatible with batch manufacturing techniques.

However, requirements are moving rather towards thicker microstructures (greater than around 10 micrometers) and often microcrystalline in order to obtain better performance. In this case, the formation of the electrical connections and that of the package cap poses a problem because the sensitive element is separated mechanically, for example by a trench, from the contact pad that is also located on the substrate. Such type of structure is illustrated in document [4] the identification of which is detailed at the end of the description. To form the electrical connection between the sensitive element and the contact pad, the trench has to be crossed. The trench may be locally filled with dielectric material in a zone that is going to support the electrical connection. Local filling is taken to mean a filling in thickness but not necessarily over the whole length of the trench.

This technique of local filling of the trench poses a problem of manufacturing output and is likely to introduce defect zones.

In the document [5], the references of which is detailed at the end of the description, an air bridge is used to connect the summit of a sensitive element located on a substrate to a contact pad located on the same substrate. The sensitive element and the contact pad have different thicknesses, the thickness of the sensitive element being greater than that of the pad. Dielectric material is deposited on the substrate and along the side of the sensitive element to act as a base for the conductor deposition that is going to constitute the air bridge. This material is then removed, freeing the air bridge.

If a package cap is used, it suffices to deposit it as described in documents [2] or [3] before removing the material serving as the basis for the air bridge.

The disadvantages of these techniques are that they are complex, that they have an effect on the manufacturing output, that they lead to microstructures in which the cost is high and they may introduce defects into the microstructures. They require in particular the use of two layers suspended one above the other, one leading to the air bridges, the other to the package cap.

DESCRIPTION OF THE INVENTION

The present invention has precisely the aim of proposing a microstructure that does not have the above mentioned disadvantages.

In order to achieve these aims, the invention is a microstructure comprising in a first layer insulated from a substrate by an insulator layer at least one sensitive element connected to at least one contact pad by an electrical connection and protected by a package cap. According to the invention, the sensitive element, the contact pad and the connection form an assembly delimited in the first layer by at least one trench, said assembly being covered by the package cap, said package cap comprising at least one opening above the contact pad and being integral with the contact pad on the edges of the opening and of a zone located beyond the trench in relation to the assembly.

Thus the package cap covers all the assembly while conserving an opening for access to the contact pad.

The package cap may be sealed in a leak tight manner in such a way as to define a leak tight cavity in which is located the sensitive element.

In this configuration, the package cap comprises at least one orifice capable of being sealed with a plug in such a way as to be able to control the atmosphere of said cavity.

The electrical connection, the contact pad and the sensitive element are preferably formed of the same material.

The package cap may be formed in dielectric material, of a conductor or semi-conductor material.

In order to facilitate the formation and to avoid introducing defects stemming for example from the difference of behavior between the different materials, it is preferable that the assembly including the sensitive element and the package cap are formed of the same conductor or semi-conductor material.

One then provides for a dielectric layer to insulate the package cap from the contact pad. In the same way, a dielectric layer insulates the package cap from the zone.

In order to facilitate making of the contact, one may provide that the contact pad is covered with a conductive band at the level of the opening.

With an aim of mechanical strengthening, the package cap may comprise at least one pillar resting on a zone of the sensitive element. Said pillar has a mechanical role but it may also have an electrical role.

The zone of the sensitive element on which the pillar rests is preferably integral with the substrate.

In order to avoid the package cap electrically charging, it is possible to raise the package cap to the same potential as a part of the sensitive element, to the same potential as the substrate or any previously selected point.

The pillar, by being supported on the zone of the sensitive element, may then contribute with the package cap to forming an electrical connection with the zone.

When the package cap is formed in conductor or semi-conductor material, the pillar may be electrically insulated from the sensitive element if the role of the pillar is only mechanical.

The present invention further concerns a method for manufacturing a microstructure comprising on a substrate at least one sensitive element connected to at least one contact pad by an electrical connection. Said method comprises the following steps:

forming on the substrate a first layer intended to form the sensitive element, the electrical connection and the contact pad, etching of the first layer on the contours of the sensitive element, the electrical connection and the contact pad in such a way that they form an assembly delimited by at least one trench, forming above the first etched layer a sacrificial layer and shaping to form an impression of a package cap to be deposited subsequently, forming on the impression a second layer intended to form the package cap and shaping of the second layer by etching at least one opening above the contact pad, at least one orifice through which is eliminated the sacrificial layer, making the package cap integral on the one hand with the contact pad on the edges of the opening and on the other hand with a zone that lines the trench beyond the assembly.

This type of method has the advantage of being particularly simple and therefore more economical than conventional methods.

The elimination of the sacrificial layer may liberate a leak tight cavity defined by the package cap, the method comprises a step of forming a plug in the orifice after control of the atmosphere found in the cavity.

The method may comprise before the step of etching of the first layer, a step of depositing a dielectric layer on the contact pad to insulate the package cap from the contact pad around the opening when the package cap is formed in conductor or semi-conductor material.

The method may comprise before the step of etching of the first layer, a step of depositing a dielectric layer on the zone to insulate the package cap from the zone when the package cap is formed in conductor or semi-conductor material.

The step of shaping the sacrificial layer may provide for the etching of at least one sink intended to form a mold for a pillar of the package cap resting on a zone of the sensitive element.

When the package cap comprises at least one pillar resting on a zone of the sensitive element and when the package cap is conductor or semi-conductor, the dielectric layer may also be deposited at the level of the zone of the sensitive element.

The method may comprise a step of depositing a conductor material at the summit of the contact pad at the level of the opening in order to improve the making of contact.

BRIEF DESCRIPTION OF DRAWINGS

The present invention will be better understood on reading the description of embodiments given purely by way of indication and is nowise limitative and by referring to the appended drawings in which.

Identical, similar or equivalent parts of the different figures described hereafter bear the same numerical references in such a way as to facilitate going from one figure to another.

In order to make the figures clearer, the different parts represented in them are not necessarily to the same scale.

DETAILED DESCRIPTION OF SPECIFIC EMBODIMENTS

Figure 1A:
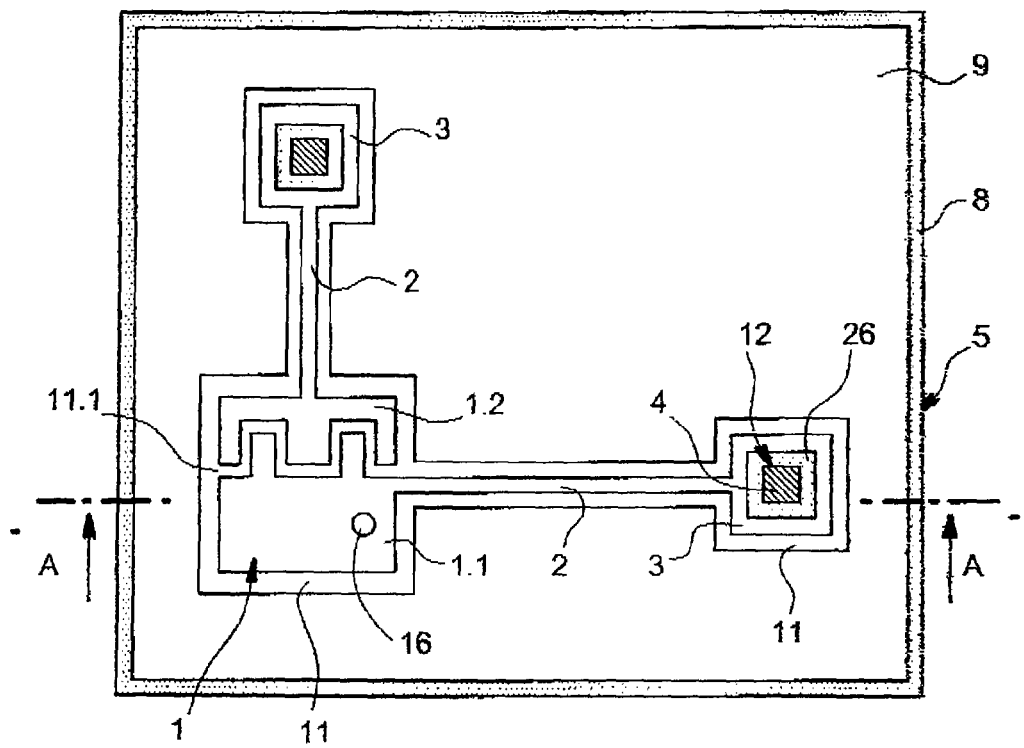
FIGS. 1A, 1B show an overhead view and an AA cross-sectional view of a microstructure according to the invention.
Figure 1B:
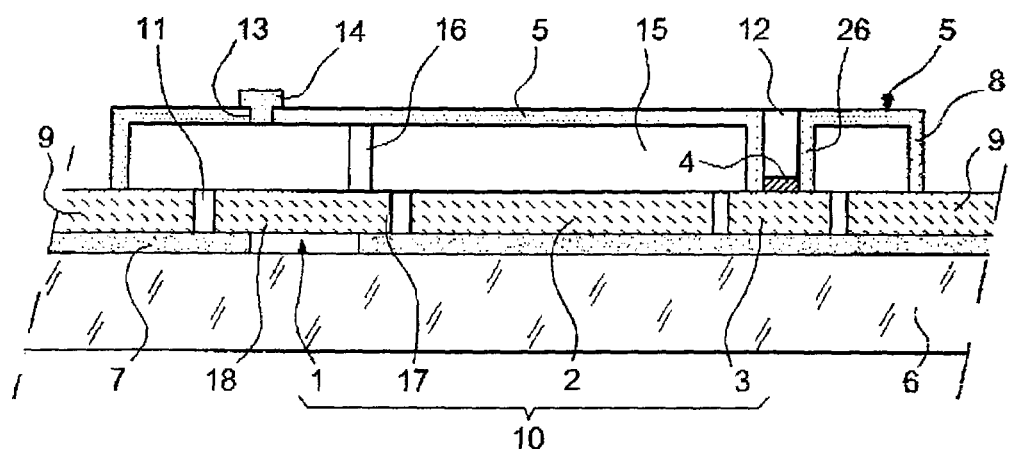
Figure 3:
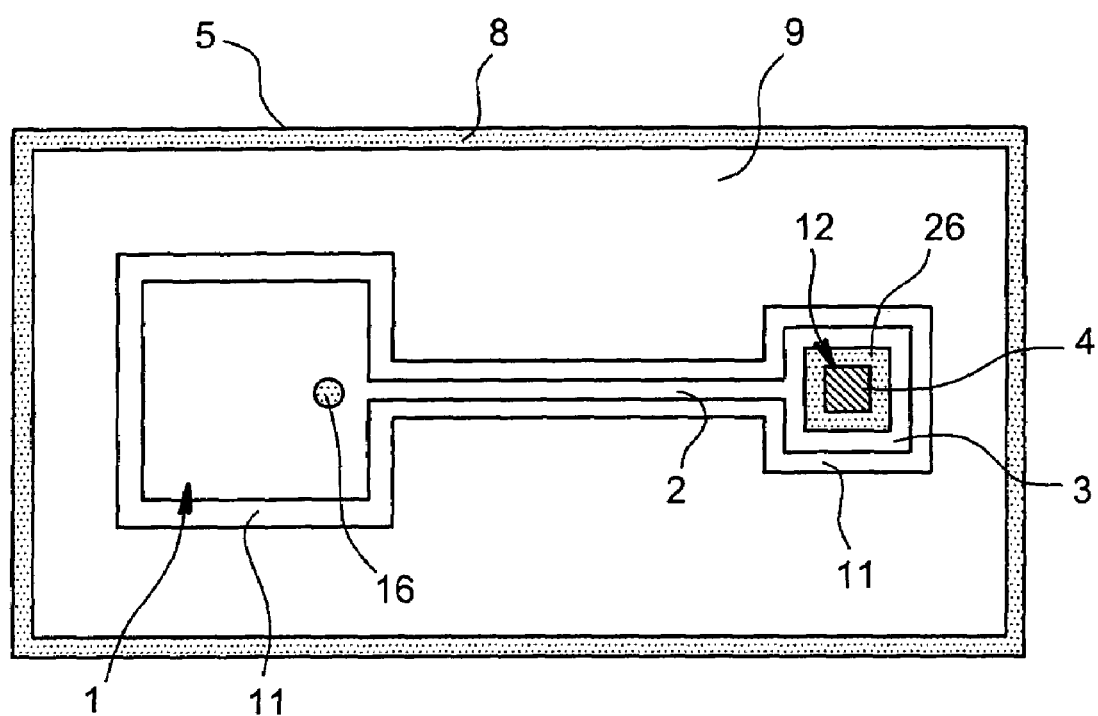
FIG. 3 represents an overhead view of an embodiment of a microstructure according to the invention.

One refers to FIGS. 1A, 1B and to FIG. 3. The microstructure that they represent comprises at least one sensitive element 1 on a substrate 6. Said sensitive element 1 may be for example a suspended weight of an acceleration sensor. One could have envisaged that it is an arm of an actuator, an armature of a variable capacity device, a pair of interdigitized electrodes as in FIG. 1A or other.

Said sensitive element 1 may be one piece as in FIG. 3 or comprise several disjointed parts 1.1, 1.2 separated by a trench 11.1 as shown in FIG. 1A. Among these parts 1.1, 1.2 some may be required to move in relation to the substrate 6 and others not.

Said sensitive element 1 is intended to be connected through the intermediary of at least one electrical connection 2 to a contact pad 3. The electrical connection 2, the contact pad 3 and the sensitive element 1 are on the same substrate 6. They are preferably in a thick layer. The layer is taken to mean a layer greater than around 10 micrometers. The sensitive element 1, the electrical connection 2 and the contact pad 3 form an assembly 10 that is delimited by a trench 11. According to a characteristic of the invention, the assembly 10 is covered by a package cap 5 that is integral with a zone 9 of The first layer 20 located beyond the trench 11 compared to the assembly 10. Said zone 9 of the first layer edges the trench beyond the assembly 10.

Contact pad is taken to mean a conductor or semi-conductor protuberance that contributes to forming an electrical contact. When the pad is in semi-conductor material, as one assumes in the example described, it is preferable to cover the top of the contact pad 3 with a conductive band preferably metallized 4 to facilitate the making of contact.

The contact pad 3, the electrical connection 2 and the sensitive element 1 are formed in a same material.

When the sensitive element 1 comprises several disjointed parts 1.1, 1.2, one provides for several electrical connections 2 to connect the different parts 1.1, 1.2 to the contact pads 3. In FIG. 3, in which the sensitive element 1 is one piece, only a single electrical connection 2 and only a single contact pad 3 have been represented.

The electrical connection 2 is integral with a part at least of the sensitive element 1 and/or the contact pad 3. The expression "a part at least of the sensitive element" covers the sensitive element that is one piece as in FIG. 3. Preferably, it is the electrical connection 2 and the contact pad 3 that are integral.

In other configurations that are particularly simple to form, as in FIG. 1A and FIG. 2, the electrical connection 2 is integral with both a part at least of the sensitive element 1 and the contact pad 3. The electrical connection 2 prolongs the part of the sensitive element 1 and ends in one piece by the contact pad 3.

The assembly 10 is located on a substrate 6 totally or partially covered (at least at the start of the manufacturing steps) with a sacrificial layer 7. Said substrate 6 and the sacrificial layer 7 are shown in FIG. 1B. The sensitive element 1, the electrical connection 2 and the contact pad 3 are formed in conductor or semi-conductor material. In order to facilitate the manufacture, it may be of a layer of silicon from a substrate known as SOI (Silicon On Insulator). The sacrificial layer 7 is then the insulator layer of the SOI substrate. As for the substrate referenced 6 in the present description, it may be a handle fastened to the SOI substrate. In a variant, the substrate 6 may correspond to the silicon from a SOI substrate, the sacrificial layer 7 being the insulator layer of the SOI substrate.

The package cap 5 covers the assembly 10, in other words at the same time the sensitive element 1, the electrical connection 2 and the contact pad 3, this was not the case in the prior art with thin films since the edge of the package cap crossed the electrical connection. This difference is important because the crossing with an electrical connection can only be achieved with thin films, otherwise one encounters problems of leak tightness and/or electrical insulation.

The package cap 5 has an edge 8 that is fastened at the level of said zone of the first layer 20 that edges the trench 9 of the first layer 20. Said zone 9 takes the form of a frame 9 that is separated from the assembly 10 by the trench 11 and which is integral with the substrate. Preferentially, the edge 8 of the package cap 5 is hermetically fastened to the frame 9 if the sensitive element 1 must be located in an environment different to the ambient environment.

The assembly 10 and the frame 9 may be formed for example by monocrystalline silicon deposited by epitaxy on the SOI substrate.

The package cap 5 comprises, at the level of the contact pad 3, an opening 12 that makes it possible to access the conductive band 4 and thus the contact pad 3. The package cap 5 comprises a part 26 integral with the contact pad 3 on the edges of the opening 12. When the package cap 5 is leak tight, the part 26 is attached in a leak tight manner to the contact pad 3.

The package cap 5 contributes to delimiting a cavity 15 in which is located the sensitive element 1 but also a part of the contact pad 3 and the electrical connection 2. Said cavity 15 may thus be hermetically subjected to a controlled atmosphere for example a vacuum or be filled with a fluid such as air or an inert gas, for example argon or nitrogen. The package cap 5 may be equipped with an orifice 13 that enables in particular an access to the cavity 15. Said orifice is intended to be sealed by a leak tight plug 14 when the cavity 15 contains the appropriate atmosphere. Said plug 14 may be formed for example in silicon oxide or in PSG (Phosphorous Silicate Glass) type glass.

The package cap 5 may be formed in a dielectric material, which is what we have attempted to show in FIG. 1B.

In a particularly advantageous variant, the package cap 5 may be formed in a conductor or semi-conductor material. Said material may be the same as that of the assembly 10 particularly if it is polycrystalline silicon. In this configuration, one inserts between the package cap 5 and the contact pad 3 a dielectric layer 22 to electrically insulate it from said contact pad 3. This configuration is illustrated in FIG. 2H. In the same way, one inserts if necessary between the edge 8 of the package cap 5 and said zone 9 of the first layer 20 to the dielectric material 22.

The package cap may then be used to interconnect different zones 17 of the sensitive element 1 and this is achieved through the intermediary of pillars 16 that protrude in the cavity 15 from the package cap 5 and which each come into electrical contact with a zone of the sensitive element 1. Thus several zones of the sensitive element 1 may be taken to the potential of the substrate for example or to the potential of a specific point by means of the package cap 5.

The package cap 5 will be formed in a material chosen in particular for its mechanical strength, it must be capable of protecting the sensitive element 1 during its use even under difficult conditions of pressure, acceleration or impact, but also during the manufacture of the microstructure. It must be able to withstand variations in pressure and/or temperature. To form the package cap one may use, for example, silicon, glass, quartz, metal. A material that is well suited is polycrystalline silicon.

An advantage provided by the fact that the package cap 5 is formed in a conductor or semi-conductor material is that it may be taken to an imposed potential while connecting it electrically to at least one zone 17 of the sensitive element 1. This potential control makes it possible to avoid potential variations linked to the environment such as accumulations of electrostatic charges. Said electrical connection may be formed by at least one pillar 16 that rests on the zone 17 of the sensitive element 1.

Said pillar 16 further contributes to assuring a mechanical maintaining of the package cap 5 in relation to the sensitive element 1. It has been seen above that the sensitive element 1 could comprise at least one mobile part, said part corresponds to a region 18 suspended above the substrate 6.

At the level of the suspended region 18, the substrate 6 is exempt of sacrificial layer 7. It is preferable that the zone 17 at the level of which the pillar 16 rests against is not a suspended region 18. It lies on the sacrificial layer 7 and is thus integral with the substrate 6. The pillar 16 assures a mechanical anchoring and this characteristic is advantageous whether the package cap 5 is conductor, semi-conductor or dielectric. A pillar 16 has been represented in FIGS. 1A, 1B. One assumes that its role is only mechanical since the package cap is formed in a dielectric material.

On the other hand, when the package cap 5 is formed in semi-conductor or conductor material, one may give to at least one pillar 16 only a role of mechanical support and not an electrical role. One then insulates the pillar 16 from the sensitive element 1 by the dielectric layer 22. Said type of pillar 16 may be seen in FIG. 2G. The dielectric layer 22 is at its base.

We will now describe an example of a method for manufacturing a microstructure according to the invention. In the description that follows the different steps employ conventional microelectronic techniques of depositing, masking and etching, which is why they are not detailed but they will not pose any problem to those skilled in the art.

One begins with a substrate 6 that may be in semi-conductor material. One covers it with a sacrificial insulator layer 7 that may be in silicon oxide.

Figure 2A:
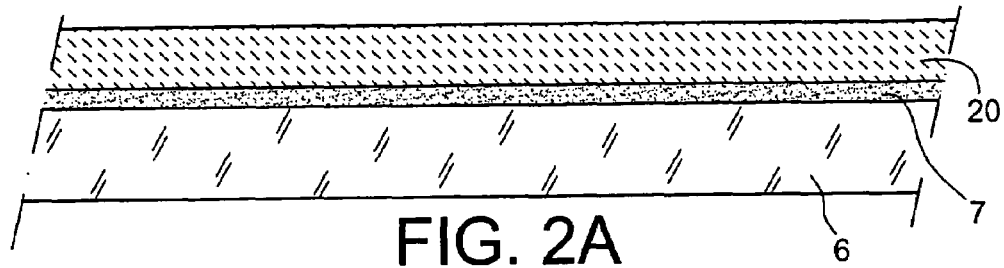
FIGS. 2A to 2H show steps of forming a microstructure according to the invention.

One covers the sacrificial layer 7 of a first layer 20 in conductor or semi-conductor material, for example in polycrystalline silicon or in monocrystalline silicon in the case of a SOI substrate (FIG. 2A). This layer is a thick film, it may have a thickness of around 20 micrometers for example.

Figure 2B:
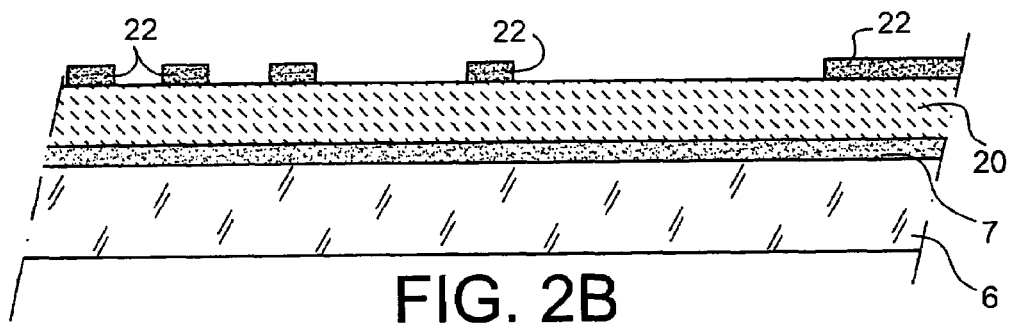

If the package cap 5, which will be formed later, is conductor or semi-conductor, one deposits at the level of the places where the package cap is going to be attached to the first layer 20, the dielectric layer 22 in insulating material for example silicon nitride (FIG. 2B). Silicon nitride is often preferred to silicon oxide because the etching is selective, which is useful during the etching of the sacrificial layer. If the package cap comprises a pillar that has to be electrically insulated from the sensitive element, one also deposits an insulating layer 22 at the level of the zone where the pillar is going to rest against the sensitive element.

One etches, for example by reactive ion etching, in the first layer 20 the contours of the sensitive element 1 and of one or several electrical connections 2 each intended to cooperate with a contact pad 3. The sensitive element 1, the electrical connection(s) 2 and the contact pad(s) 3 form an assembly 10. As has been seen previously, the sensitive element 1 may be in several distinct parts 1.1, 1.2 and the connection 2 is integral with a part at least of the sensitive element and/or the contact pad. It is conceivable that the sensitive element 1 comprises at least one recess 21, the usefulness of which will be explained hereafter.

The etching thus forms the trench 11 that surrounds the assembly 10 and further delimits the frame 9 on which the package cap is going to be fastened.

The etching also forms the trench 11.1 that separates the distinct parts of the sensitive element.

Figure 2C:
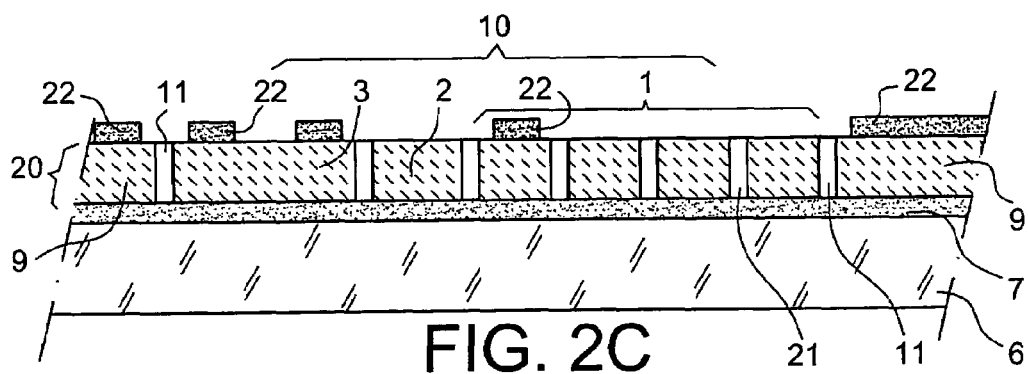

Said etching stops at the sacrificial layer 7 (FIG. 2C). When the sensitive element 1 comprises a region 18 suspended above the substrate 6, it is preferable to provide, at the level of the suspended region 18, for the formation by etching of the recess 21 in order to be able to carry out subsequently an elimination of the sacrificial layer 7 during the liberation of the suspended region 18.

Figure 2D:
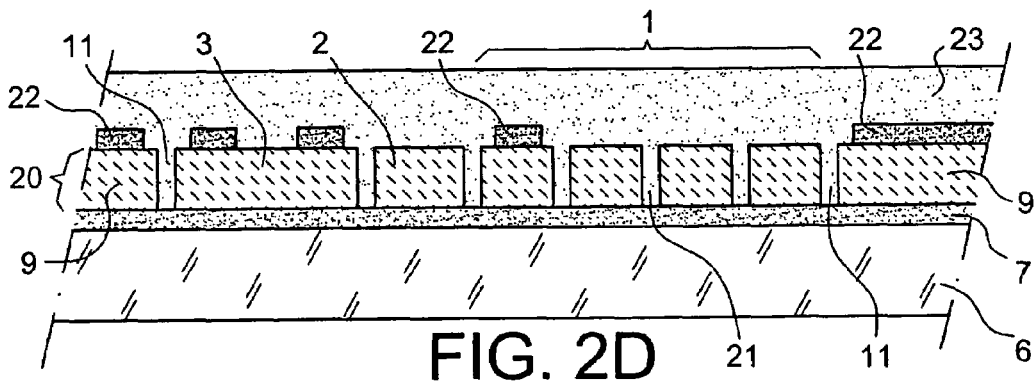
Figure 2E:
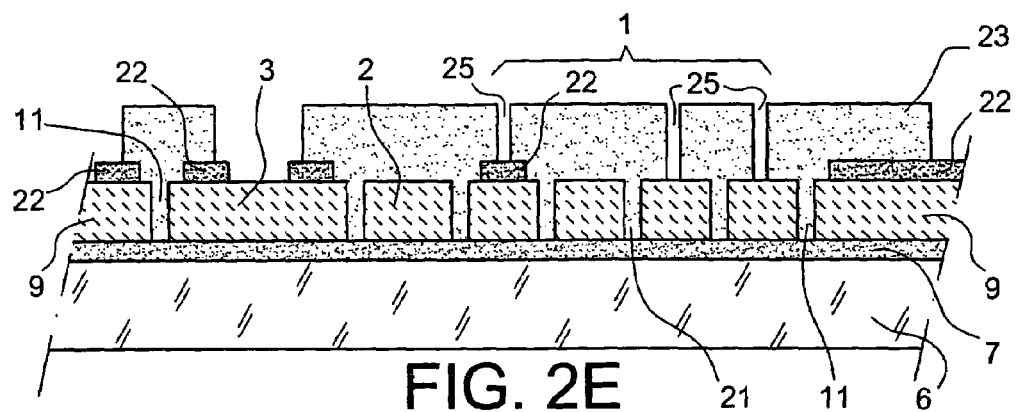

One covers the first layer 20 thus etched and any dielectric layer 22 of a second sacrificial layer 23 (FIG. 2D). Said second sacrificial layer 23 may be formed in the same material as the first sacrificial layer 7, it may be for example in phosphorous silica glass. Said second sacrificial layer 23 serves to planarize the surface and impression for the package cap that is going to be formed subsequently. Said second sacrificial layer 23 is going to be modeled as a function of the shape that the interior of the package cap must have. One is therefore going to etch said second sacrificial layer 23 at the places where the package cap has to come into contact (direct or indirect) with on the one hand the contact pad 3 if necessary the sensitive element 1 and on the other hand the frame 9 (FIG. 2E). As in FIG. 1B, the package cap 5 will have pillars 16 resting on the sensitive element 1. One therefore provides for etching in the second sacrificial layer 23 of sinks 25 that serve as moulds for the pillars 16 (FIG. 2E). It will be noted that the base of one of these sinks (the one on the left) stops at a dielectric layer 22 whereas the base of the two others stops on the first layer 20. The left hand pillar is going to be electrically insulated from the sensitive element but not the others.

Figure 2F:
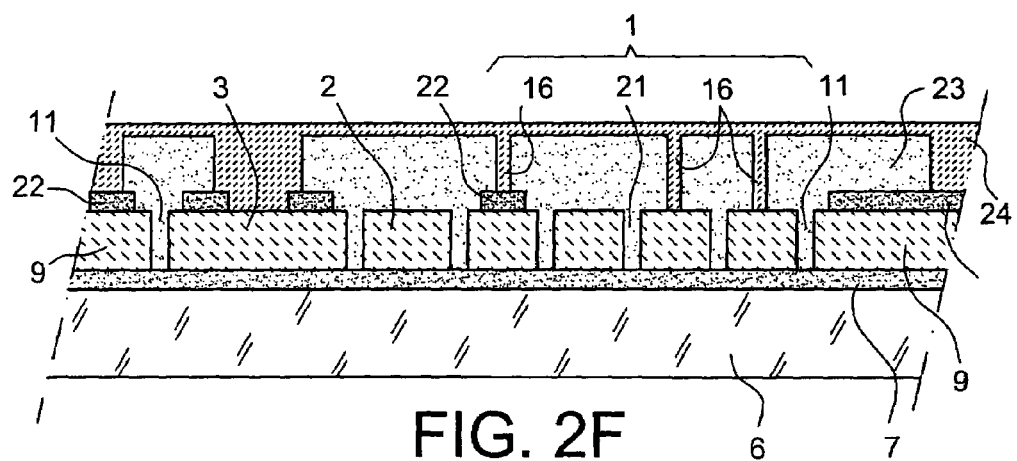
Figure 2G:
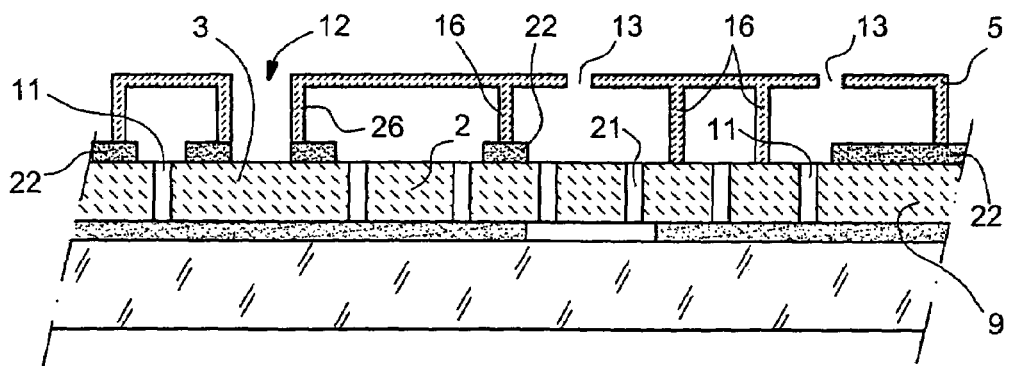
Figure 2H:
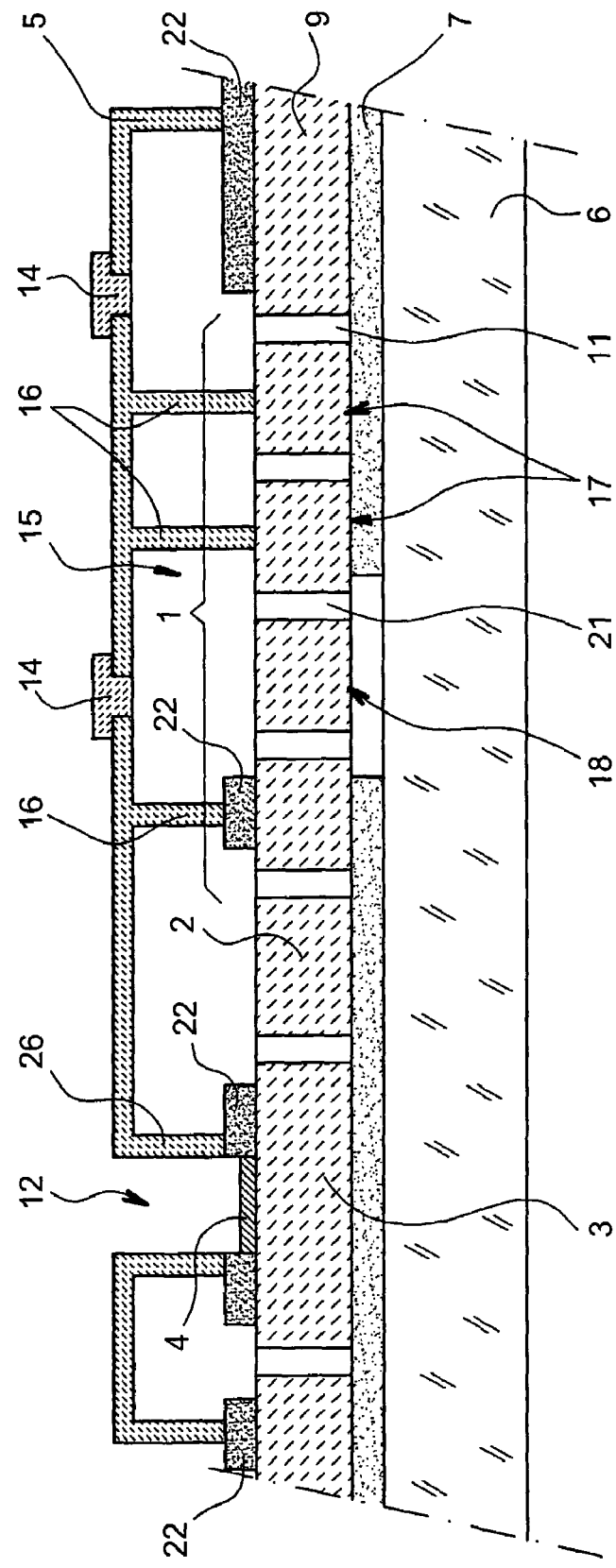

One then deposits a second layer 24 intended to form the package cap 5. Said second layer may be insulating, conductor or semi-conductor. It may be for example glass, quartz, metal, silicon and in particular polycrystalline silicon (FIG. 2F). Said second layer 24 fills the hollowed out areas of the second sacrificial layer 23 such as the sinks 25. Said second layer 24 is then etched on the contours of the package cap 5, one thus releases at least one opening 12 above the contact pad 3 to form the access to the contact pad and at least one orifice 13 that is going to serve during the elimination of the second sacrificial layer 23 and the first sacrificial layer 7 and which is going to create the cavity 15 in which one may provide for a controlled atmosphere (FIG. 2F).

One is going to eliminate for example by hydrofluoric acid based selective chemical etching the second sacrificial layer 23 to lay bare the pillars 16 and empty the cavity 15 of material. During this step or during a later step, the first sacrificial layer 7 is also eliminated locally to free the suspended region 18 of the sensitive element 1 in relation to the substrate 6. The elimination of the two sacrificial layers 7, 13 may take place at the same time particularly if they are formed in the same material. The two faces of the sensitive element 1 are then subjected to a same environment.

If the cavity 15 has to be subjected to a controlled atmosphere, said atmosphere is put in place from the orifice 13, it may be a vacuum or an appropriate fluid such as an inert gas or a fluid such as air at a controlled pressure. Each orifice 13 then has to be sealed by a plug 14. The plug may be formed in oxide, for example in silicon oxide or in phosphorous silica glass.

One forms if necessary the conductive band (metalized) 4 at the summit of the contact pad 3 (FIG. 2H).

Although several embodiments of the present invention have been represented and described in a detailed manner, it will be understood that various changes and modifications may be made, particularly with regard to the shape of the sensitive element or the nature, without going beyond the scope of the invention.

DOCUMENTS CITED

[1] "Anodic bonding of evaporated glass structured with lift-off technology for hermetically sealing" S. Sassen, W. Kupke, K. Bauer, Transducers '99, Jun. 7-10, 1999, Sendai Japan, pages 1320-1323.

[2] "Vacuum-Encapsulated Lateral Microresonators" L. Lin, K. M. McNair, R. T. Howe, A. P. Pisano, the $7^{th}$ International Conference on Solid-State Sensors and Actuators, 1993, pages 270-273.

[3] "The application of fine-grained, tensile polysilicon to mechanically resonant transducers" H. Guckel, J. J. Sniegowski, T. R. Christenson, F. Raissi, Sensors and actuators, A21-A23 (1990), pages 346-351.

[4] "Advanced micromachined sensors", B. Sulouff, H. Geitner, Mstnews n°1/01 page 34.

[5] "120 GHz long wavelength low capacitance photodetector with an air bridged coplanar metal waveguide" I-H. Tan, C-K. Sun, K. S. Giboney, J. E. Bowers, E. L. Hu, B. I. Miller, R. J. Capik, IEEE Photonics Technology Letters, vol. 7, n°12, December 1995.

The invention claimed is:

1. Microstructure comprising, at least one contact pad and at least one sensitive element connected to said at least one contact pad by an electrical connection, said sensitive element, said contact pad and said electrical connection forming an assembly, said assembly comprising a first layer insulated from a substrate by an insulator layer, said assembly including at least one trench in the first layer, said assembly being covered by a package cap, said package cap comprising at least one opening above the at least one contact pad and being integral with, on the one hand, the contact pad on the edges of the opening and, on the other hand, a zone of the first layer located beyond the trench in relation to the assembly.

2. Microstructure according to claim 1, wherein the package cap is sealed in a leak tight manner in such a way as to define a leak tight cavity in which is located the at least one sensitive element.

3. Microstructure according to claim 2, wherein the package cap comprises at least one orifice capable of being sealed by a plug in such a way as to be able to control an atmosphere of said cavity.

4. Microstructure according to claim 1, wherein the electrical connection, the contact pad and the sensitive element are formed of a same material.

5. Microstructure according to claim 1, wherein the package cap is formed of a dielectric material.

6. Microstructure according to claim 1, wherein the package cap is formed of a semi-conductor or conductor material.

7. Microstructure according to claim 6, wherein the assembly and the package cap are formed of a same conductor or semi-conductor material.

8. Microstructure according to claim 6, wherein a dielectric layer insulates the package cap from the contact pad.

9. Microstructure according to claim 6, wherein a dielectric layer insulates the package cap from the zone of said first layer located beyond the at least one trench in relation to the assembly.

10. Microstructure according to claim 1, wherein the contact pad is covered with a conductive band located inside the at least one opening.

11. Microstructure according to claim 1, wherein the package cap comprises at least one pillar resting on a zone of the at least one sensitive element.

12. Microstructure according to claim 11, wherein the zone of the at least one sensitive element is fixed to the substrate.

13. Microstructure according to claim 11, wherein the package cap is formed in a conductor or semi-conductor material, and comprises at least one pillar that rests on a zone of the at least one sensitive element, the package cap and the pillar contributing to forming an electrical connection with said zone of said at least one sensitive element.

14. Microstructure according to claim 11, wherein the package cap is formed of a conductor or semi-conductor material and the at least one pillar is electrically insulated from the at least one sensitive element.

* * * * *